(12) United States Patent
Cheng

(10) Patent No.: US 12,245,416 B2
(45) Date of Patent: Mar. 4, 2025

(54) SEMICONDUCTOR STRUCTURE HAVING BURIED WORD LINES AND METHOD OF MANUFACTURING THE SAME

(71) Applicant: NANYA TECHNOLOGY CORPORATION, New Taipei (TW)

(72) Inventor: Min-Chung Cheng, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 398 days.

(21) Appl. No.: 17/201,587

(22) Filed: Mar. 15, 2021

(65) Prior Publication Data

US 2022/0293608 A1  Sep. 15, 2022

(51) Int. Cl.
| | |
|---|---|
| *H10B 12/00* | (2023.01) |
| *H01L 21/311* | (2006.01) |
| *H01L 21/3213* | (2006.01) |
| *H01L 21/762* | (2006.01) |

(52) U.S. Cl.
CPC ...... *H10B 12/053* (2023.02); *H01L 21/31116* (2013.01); *H01L 21/31144* (2013.01); *H01L 21/32136* (2013.01); *H01L 21/32139* (2013.01); *H01L 21/76224* (2013.01); *H10B 12/34* (2023.02); *H10B 12/488* (2023.02)

(58) Field of Classification Search
CPC ......... H01L 27/10876; H01L 21/31116; H01L 21/31144; H01L 21/32136; H01L 21/32139; H01L 21/76224; H01L 27/10823; H01L 27/10891; H01L 21/32137; H01L 27/10805
See application file for complete search history.

(56) References Cited

U.S. PATENT DOCUMENTS

| | | | | |
|---|---|---|---|---|
| 5,215,930 A | * | 6/1993 | Lee | H01L 21/32134 257/E21.309 |
| 8,674,420 B2 | | 3/2014 | Yeom | |
| 9,252,238 B1 | * | 2/2016 | Trevino | H01L 29/66545 |
| 10,147,728 B1 | * | 12/2018 | Chang | H10B 12/488 |

(Continued)

FOREIGN PATENT DOCUMENTS

| | | | | | |
|---|---|---|---|---|---|
| KR | 20220013244 | * | 7/2020 | | H01L 27/108 |
| KR | 1020200092582 A | * | 7/2020 | | H10B 12/482 |

(Continued)

*Primary Examiner* — Fernando L Toledo
*Assistant Examiner* — Jahae Kim
(74) *Attorney, Agent, or Firm* — MUNCY, GEISSLER, OLDS & LOWE, P.C.

(57) ABSTRACT

The present disclosure provides a method of forming a semiconductor structure. The method comprises providing a substrate comprising an isolation region, an active region adjacent to the isolation region, and a first top surface, wherein the isolation region includes an isolation trench filled with a dielectric material, and the active region includes a gate trench filled with a gate electrode material; forming a hard mask on the substrate; and performing an etching process to partially remove portions of the dielectric material and gate electrode material exposed by the hard mask to form a second top surface of the dielectric material and a third top surface of the gate electrode material, wherein the second top surface and the third top surface are substantially at the same level and are substantially lower than the first top surface.

16 Claims, 25 Drawing Sheets

(56) References Cited

U.S. PATENT DOCUMENTS

| | | | | |
|---|---|---|---|---|
| 2014/0144876 A1* | 5/2014 | Nakagawa | ........ | H01J 37/32091 |
| | | | | 216/51 |
| 2021/0305383 A1* | 9/2021 | Mao | ................. | H01L 29/66795 |
| 2022/0077154 A1* | 3/2022 | Kim | ....................... | H10B 12/34 |

FOREIGN PATENT DOCUMENTS

| KR | 20220013244 A | 2/2022 |
|---|---|---|
| TW | I578538 B | 4/2017 |
| TW | I615921 B | 2/2018 |

\* cited by examiner

SEMICONDUCTOR STRUCTURE HAVING BURIED WORD LINES AND METHOD OF MANUFACTURING THE SAME

TECHNICAL FIELD

The present disclosure relates to a semiconductor structure and, more particularly, to a semiconductor structure having buried word lines and a method of manufacturing the same.

DISCUSSION OF THE BACKGROUND

A buried word line is a structure formed in a dynamic random access memory (DRAM) to increase the integration degree of a transistor in a cell, simplify a fabricating process, and improve a device property such as a current leakage property. In general, a trench is formed and a word line is buried in the trench to form a buried word line.

When forming buried word lines, an etch-back process is of great significance since the etch-back process produces space in trenches for filling with a conductive material. However, in a single etch-back process, the etching selectivity generally causes variations in heights of the materials for forming the buried word lines.

Therefore, there is a need to improve the etch-back process for forming buried word lines.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of forming a semiconductor structure. The method comprises providing a substrate comprising an isolation region, an active region adjacent to the isolation region, and a first top surface, wherein the isolation region includes an isolation trench filled with a dielectric material and the active region includes a gate trench filled with a gate electrode material; forming a hard mask on the substrate; and performing an etching process to partially remove the dielectric material and gate electrode material exposed by the hard mask to form a second top surface of the dielectric material and a third top surface of the gate electrode material, wherein the second top surface and the third top surface are at substantially the same level and are substantially lower than the first top surface.

In some embodiments, the method further comprises depositing a gate conductive material to cover the dielectric material and the gate electrode material.

In some embodiments, the method further comprises removing portions of the gate conductive material over the first top surface of the substrate so that the gate conductive material in the isolation trench and the gate trench is recessed below the first top surface.

In some embodiments, the formation of the hard mask comprises: forming a cap layer on the substrate, the dielectric material and the gate electrode material; forming a mask layer on the cap layer; forming an anti-reflective coating (ARC) layer on the mask layer; and forming a photoresist pattern on the ARC layer, wherein the photoresist pattern comprises a plurality of photoresist features.

In some embodiments, the mask layer is etched using the photoresist features as an etching mask to form a mask pattern comprising a plurality of mask features.

In some embodiments, the cap layer is etched using the mask features as an etching mask to form a cap pattern comprising a plurality of cap features.

In some embodiments, the cap pattern and the mask pattern together form the hard mask on the substrate.

In some embodiments, the etching method comprises: using a first plasma in a first working stage, wherein the first plasma has a first etching selectivity of the gate electrode material to the dielectric material; changing the first plasma to a second plasma in a second working stage, wherein the second plasma has a second etching selectivity of the gate electrode material to the dielectric material; and changing the second plasma to a third plasma in a third working stage, wherein the third plasma has a third etching selectivity of the gate electrode material to the dielectric material.

In some embodiments, the first working stage, the second working stage and the third working stage are performed in-situ in a single etching chamber.

In some embodiments, the first working stage comprises: a first interval, in which the first plasma is turned on and kept at a first high power and then adjusted to a low power and kept at the low power; a second interval, in which the first plasma is adjusted to the first high power and kept at the first high power and then adjusted to the low power and kept at the low power; and a third interval repeating the second interval, wherein after the third interval, a first switching step is performed to terminate the first working stage.

In some embodiments, after the first switching step, a first stabilizing period is used to change the first plasma to the second plasma.

In some embodiments, the second working stage comprises: a fourth interval, in which the second plasma is kept at a second high power and then adjusted to the low power and kept at the low power; a fifth interval, in which the second plasma is adjusted to the second high power and kept at the second high power and then adjusted to the low power and kept at the low power; and a sixth interval repeating the fifth interval, wherein after the sixth interval, a second switching step is performed to terminate the second working stage.

In some embodiments, after the second switching step, a second stabilizing period is used to change the second plasma to the third plasma.

In some embodiments, the third working stage comprises keeping the third plasma at a third high power.

In some embodiments, the second high power is different from the first high power.

In some embodiments, the third high power is lower than the first high power or the second high power.

In some embodiments, the first high power, the second high power and the third high power indicate the primary etching phases.

Another aspect of the present disclosure provides a semiconductor structure. The semiconductor structure comprises: a substrate comprising an isolation region, an active region adjacent to the isolation region, a first top surface, an isolation trench recessed into the first top surface and disposed in the isolation region, and a gate trench recessed into the first top surface and disposed in the active region; a dielectric material deposited in a lower portion of the isolation trench, wherein the dielectric material has a second top surface below the first top surface; a gate electrode material deposited in a lower portion of the gate trench, wherein the gate electrode material has a third top surface substantially at the same level as the second top surface; and a gate conductive material deposited in an upper portion of the isolation trench to cover the dielectric material and deposited in an upper portion of the gate trench to cover the gate electrode material.

In some embodiments, the dielectric material and the gate conductive material formed thereon as well as the gate electrode material and the gate conductive material formed thereon form a plurality of buried word line structures.

In some embodiments, the buried word line structure has a fourth top surface substantially at the same level as the first top surface of the substrate.

The etching method provided by the present disclosure includes changing the combination of etchants serving as the plasma in an in-situ etch-back process. The etching method comprises three working stages performed in a single etching chamber. The plasma can have different etching selectivities of polysilicon in the gate electrode material with respect to silicon dioxide in the dielectric material in the three working stages. In addition, power of the plasma is adjusted in different intervals during the first and second working stages. The primary etching phase is the period when the plasma is at a high power, while the etching by-products are removed while the plasma is at a low power. Therefore, in the etch-back process, the dielectric material in the isolation trenches and the gate electrode material in the gate trenches can be recessed into the top surface of the substrate. In addition, according to the etching method provided by the present disclosure, the top surface of the etched dielectric material and the top surface of the etched gate electrode material can be kept at a substantially identical level during the formation of buried word lines.

The foregoing has outlined rather broadly the features and technical advantages of the present disclosure in order that the detailed description of the disclosure that follows may be better understood. Additional features and technical advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3 is a schematic cross-sectional view showing the semiconductor structure in FIG. 2 before buried word lines are formed, wherein FIG. 3 is taken along the line A-A' in FIG. 2, in accordance with some embodiments of the present disclosure.

DETAILED DESCRIPTION

Figure 1:
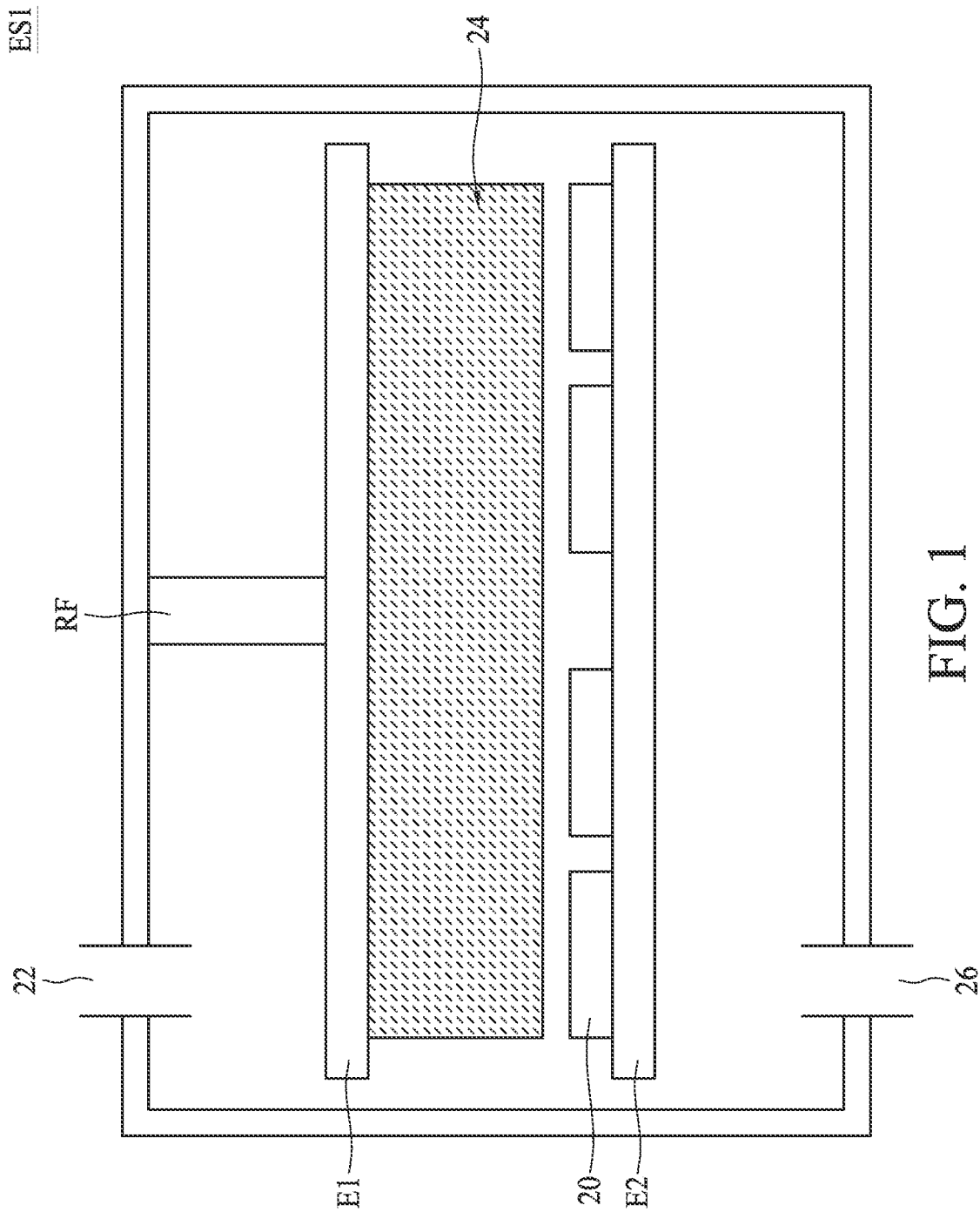
FIG. 1 is a schematic diagram showing an etching system, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of some embodiments apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An etching process generally uses an ionized gas (e.g., plasma) to etch a semiconductor stack. Plasma-etching processes are particularly useful for etching of multiple adjacent structures having fine features. However, with more stringent requirements for feature size and spacing, limitations of the plasma-etching process become apparent. For example, reactive-ion etching (RIE) is an etching technology that uses chemically-reactive plasma to remove materials deposited on a semiconductor stack. The plasma is generated under low pressure by an electromagnetic field. High-energy ions from the plasma attack the materials of the semiconductor stack and react with them.

FIG. 1 is a schematic diagram showing an etching system ES1, in accordance with some embodiments of the present disclosure. In some embodiments, the etching system ES1 is an RIE system. The etching system ES1 at least includes a power source RF and a pair of electrodes E1, E2. In an RIE process, first, a semiconductor stack 20 is placed on a wafer holder (not shown). Subsequently, several gases are introduced through a gas inlet 22. A plasma 24 is used to strike the gas mixture using the power source RF, breaking the gas mixture into energized ions. The energized ions are accelerated toward and react at the surface of the semiconductor stack 20, forming another gaseous by-product. Subsequently, the gaseous by-product is evacuated through a vacuum system 26 to finish the reactive-ion etching.

Buried word line structures in a semiconductor device involve a plurality of gate electrodes and a plurality of buried word lines, wherein the gate electrodes and the buried word lines are built in trenches in active regions and isolation regions. Generally, the buried word line structures are processed after the definition of active regions is finished, i.e., after the shallow trench isolation (ST1) process.

Figure 2:
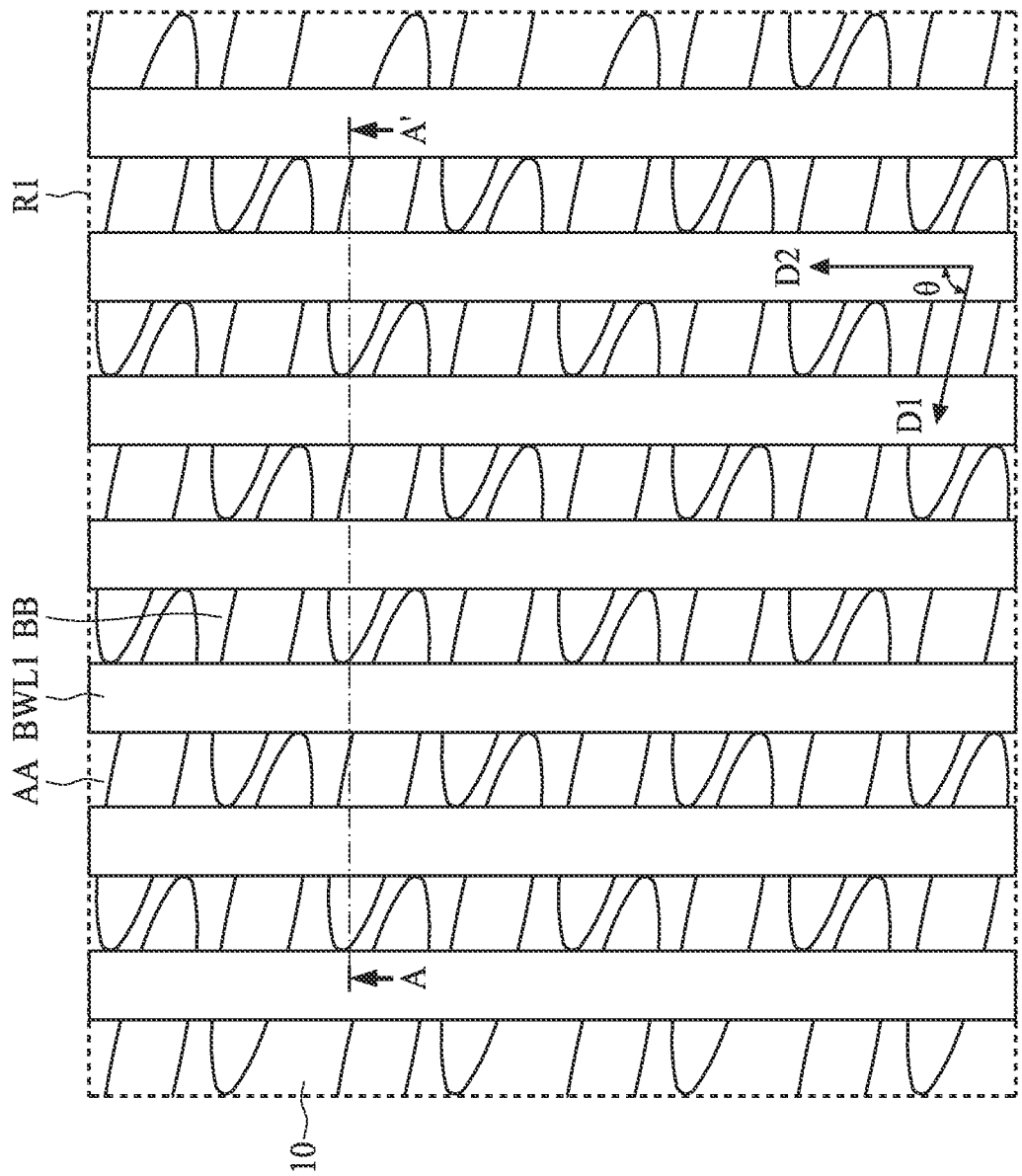
FIG. 2 is a schematic top view showing a semiconductor structure with buried word line structures, in accordance with some embodiments of the present disclosure.

FIG. 2 is a schematic top view showing a semiconductor structure ST1 with buried word line structures, in accordance with some embodiments of the present disclosure. The semiconductor structure ST1 includes an array region R1 and a periphery region (not shown) on a substrate 10. For simplicity, only elements in the array region R1 are shown. In the array region R1, the semiconductor structure ST1 includes a plurality of isolation regions BB and a plurality of active regions AA arranged with the isolation regions BB. In some embodiments, the active regions AA may be repetitively arranged at predetermined intervals and are isolated from each other by the isolation regions BB. In some embodiments, the active regions AA are disposed parallel to each other and extend along a first direction D1, as shown in FIG. 2. In some embodiments, the active regions AA are doped with various dopants to adjust electrical properties and form source regions (not shown) and drain regions (not shown) therein. The source regions and drain regions may constitute a significant portion of the array region R1. In some embodiments, a plurality of buried word line structures BWL1 are disposed on the substrate 10 and pass through the active regions AA and the isolation regions BB. In some embodiments, the average width of each buried word line structure BWL1 is about 15.0 nm. In some embodiments, the buried word line structures BWL1 are arranged equidistantly (at an equal pitch) and extend along a second direction D2. In some embodiments, the second direction D2 is substantially different from the first direction D1. In some embodiments, the second direction D2 forms a predetermined angle θ with respect to the first direction D1, wherein the predetermined angle θ is preferably less than 90 degrees. To put it another way, the active regions AA are diagonally disposed with respect to the buried word line structures BWL1.

Figure 3:
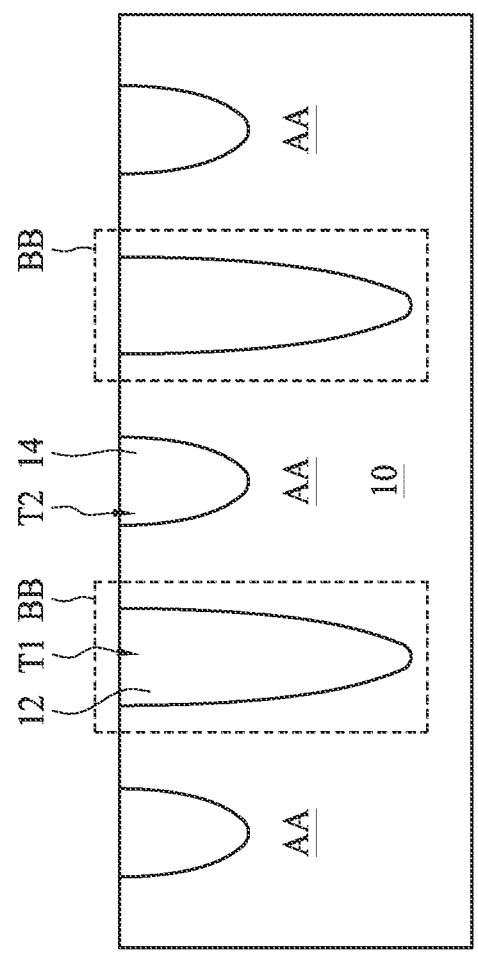

FIG. 3 is a schematic cross-sectional view showing the semiconductor structure ST1 in FIG. 2 before buried word lines are formed, wherein FIG. 3 is taken along the line A-A' in FIG. 2, in accordance with some embodiments of the present disclosure. In some embodiments, the formation of buried word lines begins after the active regions AA in the substrate 10 are formed. Specifically, first, multiple isolation trenches T1 are formed in the substrate 10. The isolation trenches T1 are completely filled with a dielectric material 12 such as silicon dioxide ($SiO_2$) to form multiple isolation regions BB. The isolation regions BB divide the substrate 10 into multiple active regions AA, wherein the active regions AA are alternately arranged with the isolation regions BB. Next, multiple gate trenches T2 are formed in the active regions AA. The gate trenches T2 are completely filled with a gate electrode material 14 such as polysilicon.

Figure 4:
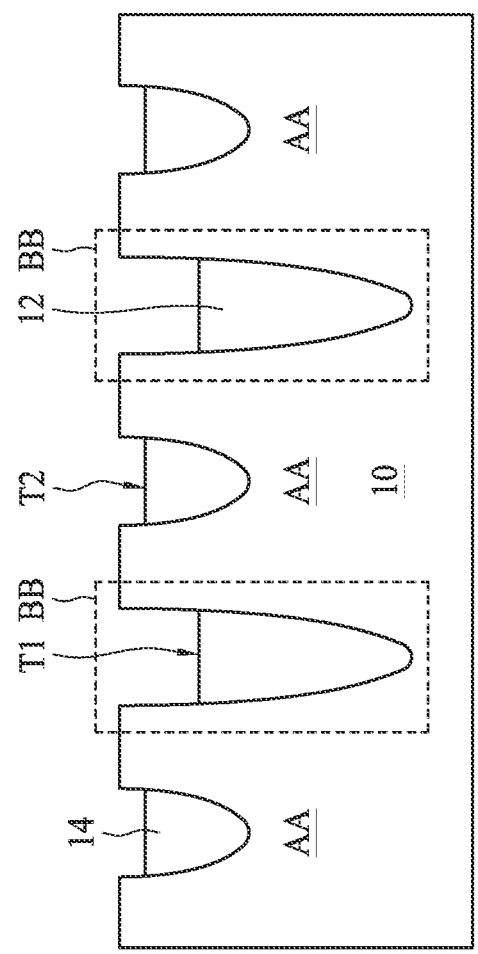
FIG. 4 is a schematic cross-sectional view showing the semiconductor structure after undergoing an etch-back process, in accordance with some embodiments of the present disclosure.

FIG. 4 is a schematic cross-sectional view showing the semiconductor structure ST1 after undergoing an etch-back process, in accordance with some embodiments of the present disclosure. Referring to FIG. 4, in some embodiments, top surfaces of the dielectric material 12 and top surfaces of the gate electrode material 14 are etched so that several recesses over the dielectric material 12 within the isolation trenches T1 and several recesses over the gate electrode material 14 within the gate trenches T2 are produced. In a first comparative embodiment, after the etch-back process, top surfaces of the dielectric material 12 and top surfaces of the gate electrode material 14 have different heights. Such problem may arise due to a difference between etching selectivities of the dielectric material 12, which is mainly silicon dioxide, and the gate electrode material 14, which is mainly polysilicon. Generally, silicon dioxide is consumed faster than polysilicon when a specific etchant is used in the etch-back process. As a result, different etching rates of the dielectric material 12 and the gate electrode material 14 result in the different heights of their top surfaces.

Figure 5:
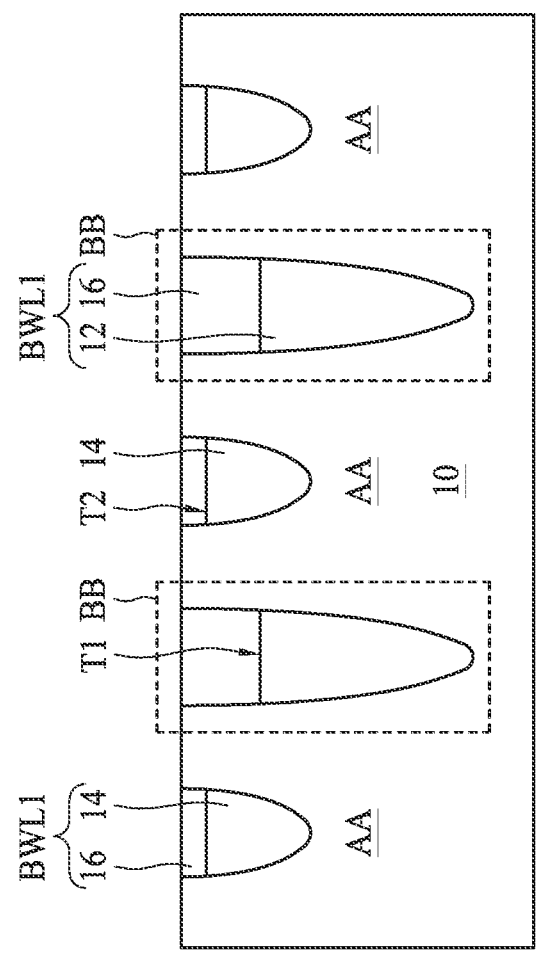
FIG. 5 is a schematic cross-sectional view showing the semiconductor structure after undergoing a gate conductive material deposition, in accordance with some embodiments of the present disclosure.

FIG. 5 is a schematic cross-sectional view showing the semiconductor structure ST1 after undergoing a gate conductive material deposition, in accordance with some embodiments of the present disclosure. Referring to FIG. 5, in some embodiments, a gate conductive material 16 is deposited to fill the recesses within the isolation trenches T1 and the gate trenches T2 to form buried word lines after the etch-back process. The dielectric material 12, the gate electrode material 14 and the gate conductive material 16 deposited thereon may form the buried word line structures BWL1 shown in FIG. 2. During the formation of the buried word line structures BWL1, the etch-back process is significant since the thickness of the dielectric material 12 or the gate electrode material 14 determines a volume of the recess within the isolation trenches T1 or the gate trenches T2, which in turn determines an amount of the gate conductive material 16 that can be deposited to fill the recess. In the first comparative embodiment, the amount of the gate conductive material 16 which can be deposited in the gate trenches T2 is greatly restricted because there is only a small amount of space available in the gate trenches T2 after the etch-back process.

Figure 6:
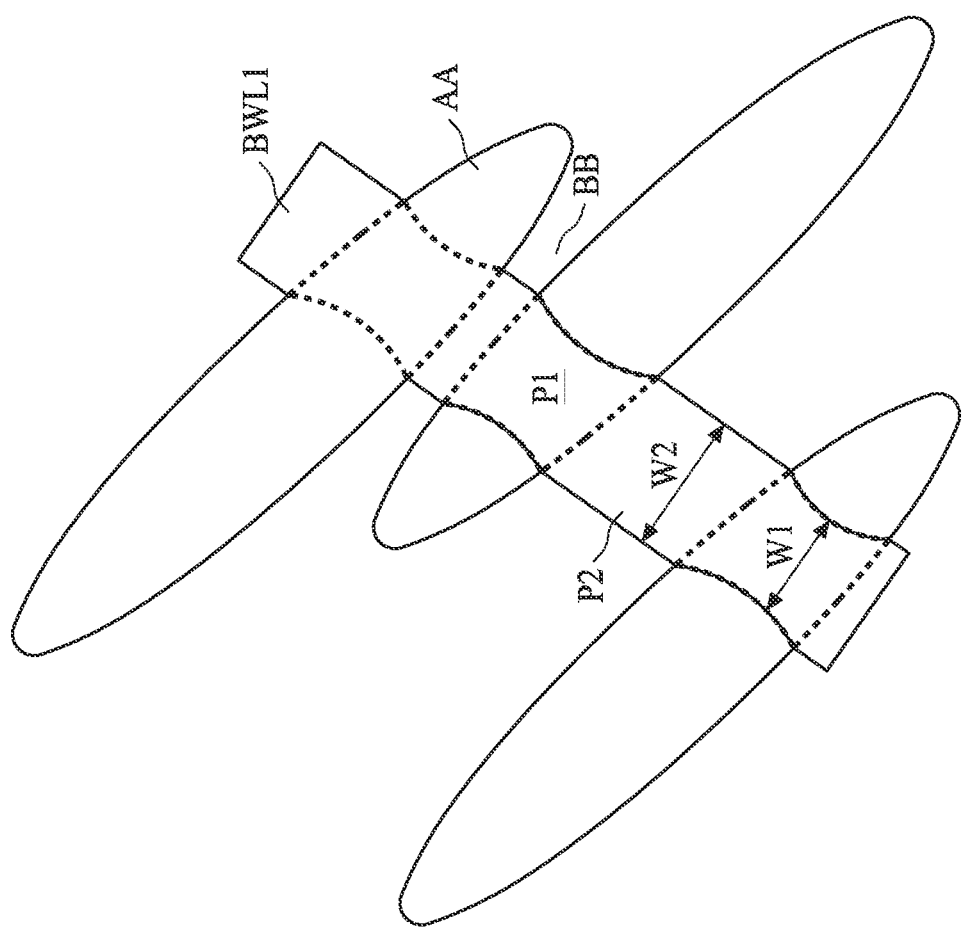
FIG. 6 is an enlarged schematic top view showing one of the buried word line structures in FIG. 2, in accordance with some embodiments of the present disclosure.

FIG. 6 is an enlarged schematic top view showing one of the buried word line structures BWL1 in FIG. 2, in accordance with some embodiments of the present disclosure. In a second comparative embodiment, the buried word line structure BWL1 has an uneven width, wherein some portions of the buried word line structure BWL1 are narrow, while some portions are wide. Specifically, the buried word line structure BWL1 includes multiple first portions P1 where the buried word line structure BWL1 spatially overlaps the active regions AA, and multiple second portions P2 where the buried word line structure BWL1 spatially overlaps the isolation regions BB. Generally, the width W1 of the first portion P1 is less than the width W2 of the second portion P2. Similar to the first comparative embodiment, the problem in the second comparative embodiment may arise from the difference between the etching rates of silicon dioxide corresponding to the first portion P1 and polysilicon corresponding to the second portion P2 while the buried word line structure BWL1 is being fabricated. Therefore, there is a great need to improve the etch-back process in the formation of buried word lines.

Figure 7:
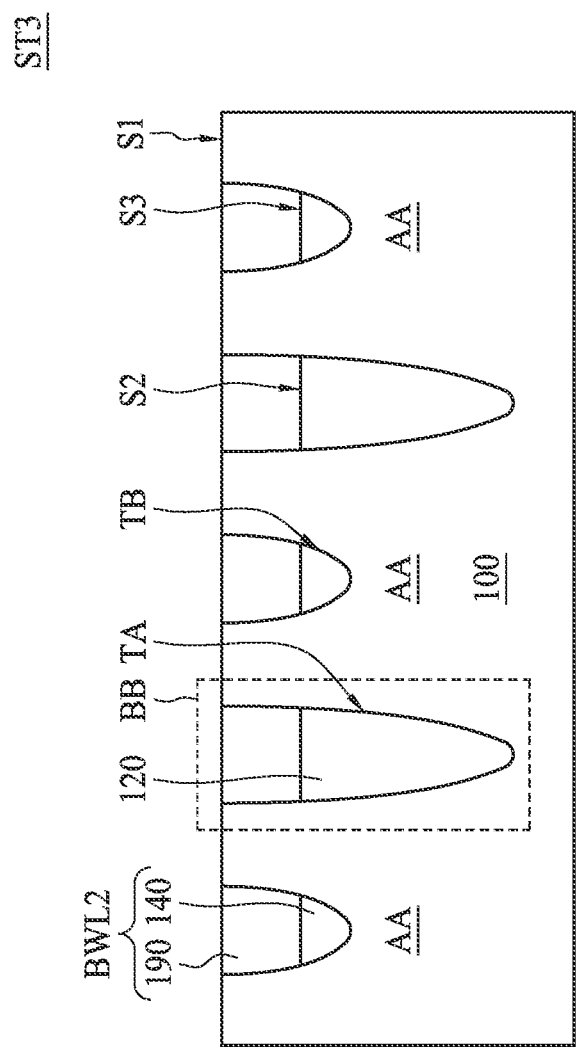
FIG. 7 is a schematic cross-sectional view of a semiconductor structure, in accordance with some embodiments of the present disclosure.

One aspect of the present disclosure provides a semiconductor structure with buried word lines. FIG. 7 is a schematic cross-sectional view of a semiconductor structure ST3, in accordance with some embodiments of the present disclosure. With reference to FIG. 7, the semiconductor structure ST3 comprises a substrate 100, a plurality of isolation regions BB in the substrate 100 and a plurality of active regions AA surrounded by the isolation regions BB. In some embodiments, the substrate 100 has a substantially planar top surface S1. The active regions AA are alternately arranged with the isolation regions BB. In some embodiments, the active regions AA may be arranged at predetermined intervals in the substrate 100.

In some embodiments, an isolation trench TA is recessed into the top surface S1 and disposed in each of the isolation regions BB. A dielectric material 120 is deposited in a lower portion of the isolation trench TA. In some embodiments, the dielectric material 120 has a top surface S2 below the top surface S1 of the substrate 100. In addition, a gate trench TB is recessed into the top surface S1 and disposed in each of the active regions AA. A gate electrode material 140 is deposited in a lower portion of the gate trench TB. In some embodiments, the gate electrode material 140 has a top surface S3 below the top surface S1 of the substrate 100. In some embodiments, the top surface S2 of the dielectric material 120 and the top surface S3 of the gate electrode material 140 are substantially at the same level.

A gate conductive material 190 fills an upper portion of the isolation trench TA to cover the dielectric material 120 and fills an upper portion of the gate trench TB to cover the gate electrode material 140. The dielectric material 120 and the gate conductive material 190 formed thereon as well as the gate electrode material 140 and the gate conductive material 190 formed thereon form a plurality of buried word line structures BWL2 buried in the substrate 100. Each of the buried word line structures BWL2 has a top surface substantially coplanar with the top surface S1 of the substrate 100.

Figure 8:
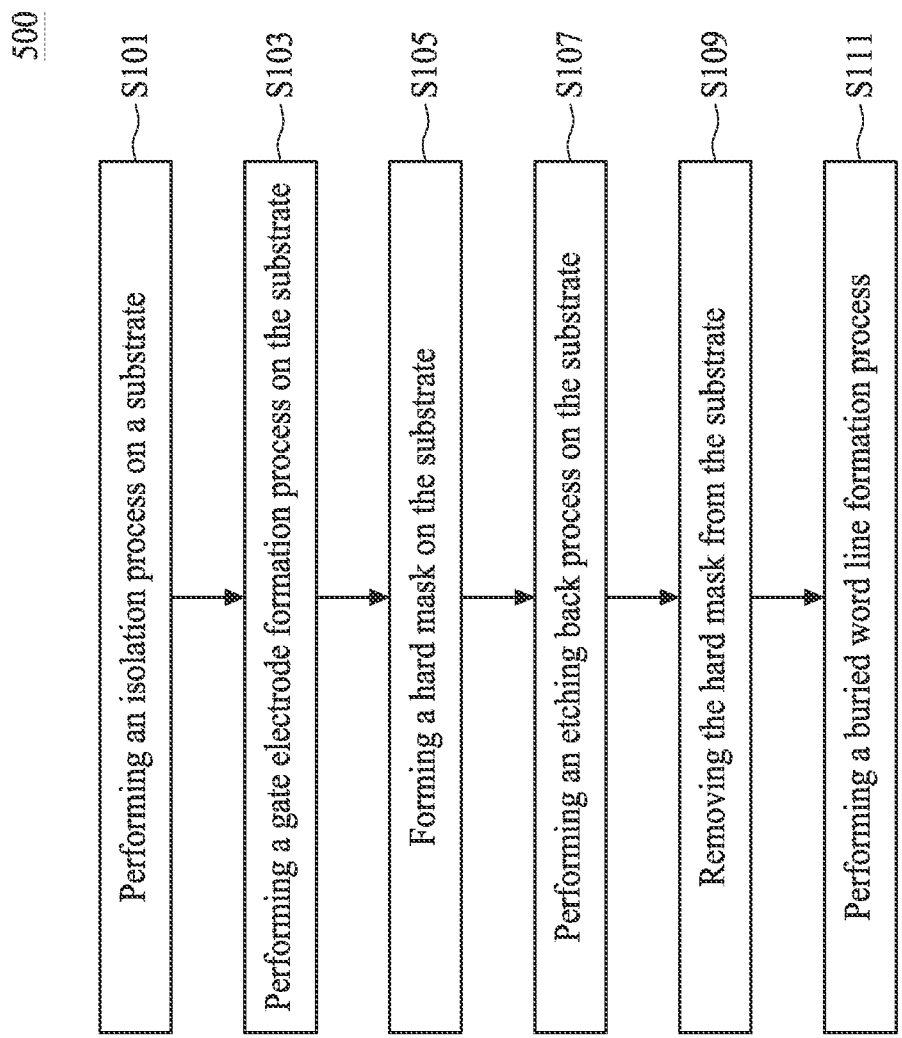
FIG. 8 is a flow diagram showing a method for fabricating the semiconductor structure in FIG. 7, in accordance with some embodiments of the present disclosure.

Another aspect of the present disclosure provides a method for fabricating a semiconductor structure with buried word lines. FIG. 8 is a flow diagram showing a method 500 for fabricating the semiconductor structure ST3 in FIG. 7, in accordance with some embodiments of the present disclosure. FIG. 9 to FIG. 24 are schematic cross-sectional views showing sequential fabrication stages according to the method 500 in FIG. 8, in accordance with some embodiments of the present disclosure.

Figure 9:
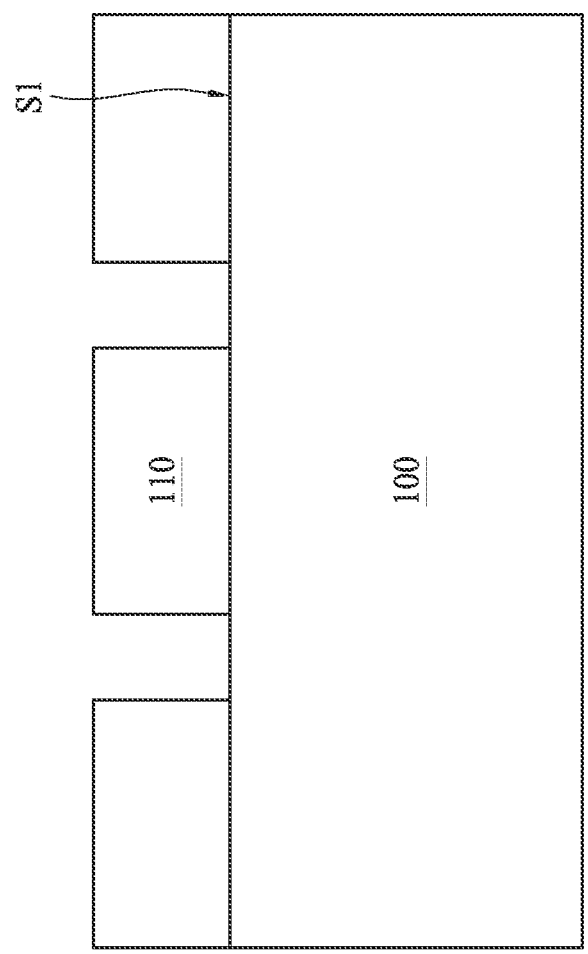
FIG. 9 to FIG. 24 are schematic cross-sectional views showing sequential fabrication stages according to the method in FIG. 8, in accordance with some embodiments of the present disclosure.
Figure 10:
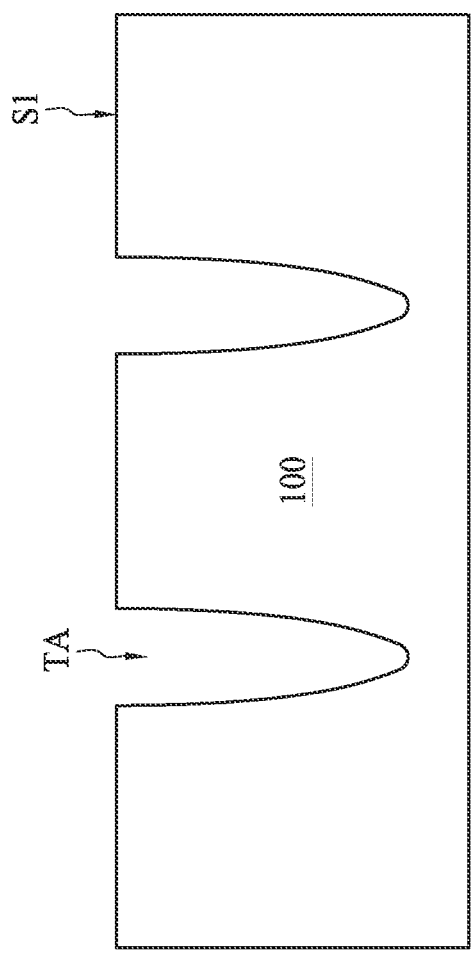
Figure 11:
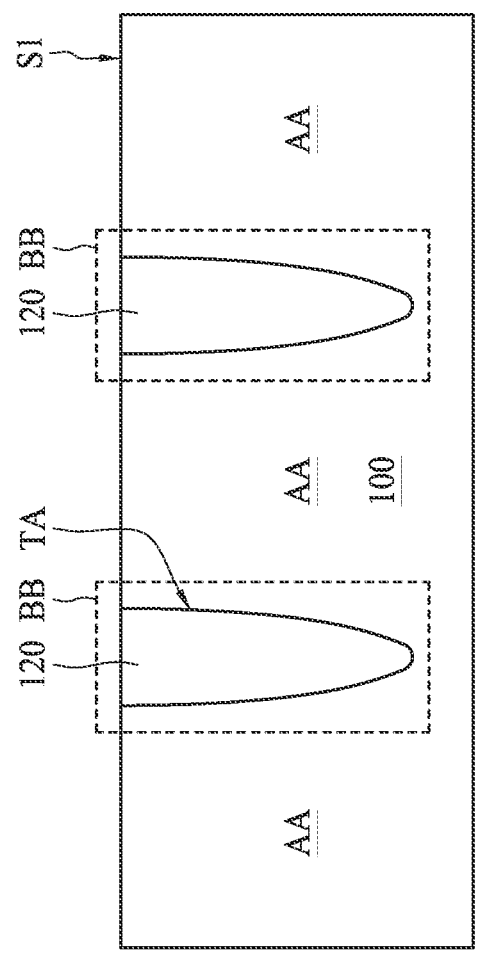

With reference to FIG. 9 to FIG. 11, an isolation process is performed on a substrate according to step S101 in FIG. 8. In some embodiments, the isolation process is a shallow trench isolation (ST1) process, which may define at least an active region AA. Specifically, the ST1 process at least includes a lithographic process, an etching process and a deposition process. First, referring to FIG. 9, a substrate 100 having a top surface S1 is provided. In some embodiments, the substrate 100 may include silicon (S1), silicon germanium (SiGe), gallium arsenide (GaAs), or other suitable semiconductor materials. A first photoresist pattern 110 is formed on the top surface S1 of the substrate 100. In some embodiments, the first photoresist pattern 110 may define the location of isolation trenches to be formed.

Next, referring to FIG. 10, the substrate 100 is etched using the first photoresist pattern 110 as an etching mask to form several isolation trenches TA. After the isolation trenches TA are formed in the substrate 100, the first photoresist pattern 110 is removed using an ashing process or a wet strip process.

Subsequently, referring to FIG. 11, a dielectric material 120 is deposited to fill the isolation trenches TA. In some embodiments, the dielectric material 120 may include silicon dioxide ($SiO_2$) or other suitable materials formed using a CVD process or a spin-on coating (SOC) process. In some embodiments, a chemical mechanical polishing (CMP) process is performed to remove the dielectric material 120 above the top surface S1 of the substrate 100. After the isolation trenches TA are filled with the dielectric material 120, multiple isolation regions BB are formed. In some embodiments, an active region AA is surrounded by the isolation regions BB. In addition, the active regions AA are alternately arranged with the isolation regions BB. In some embodiments, the active regions AA are arranged at predetermined intervals in the substrate 100.

Figure 12:
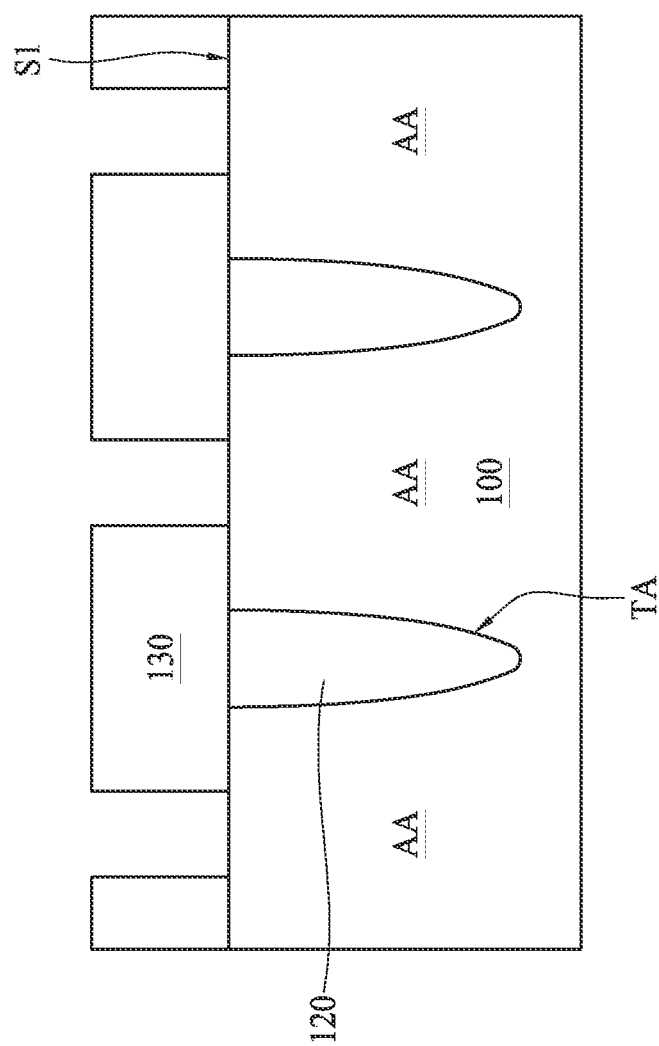
Figure 13:
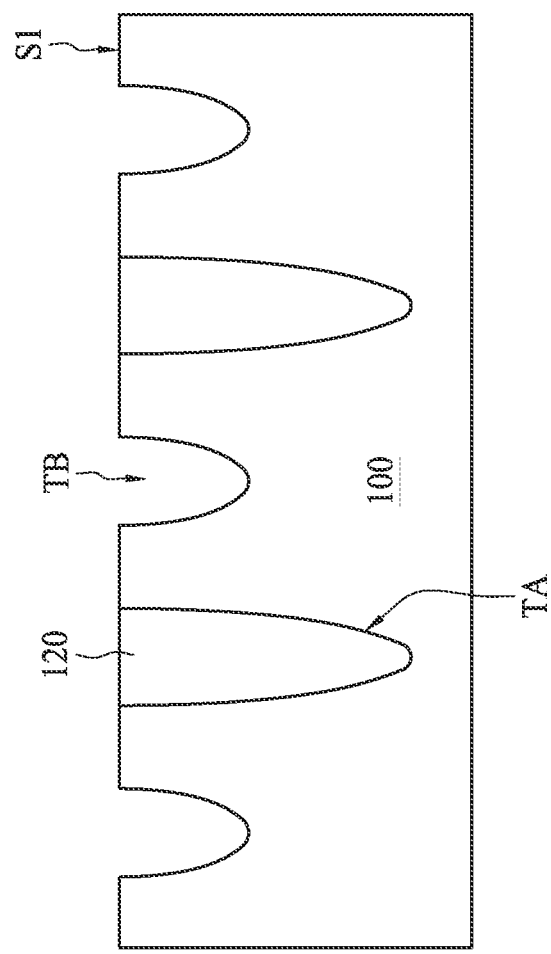
Figure 14:
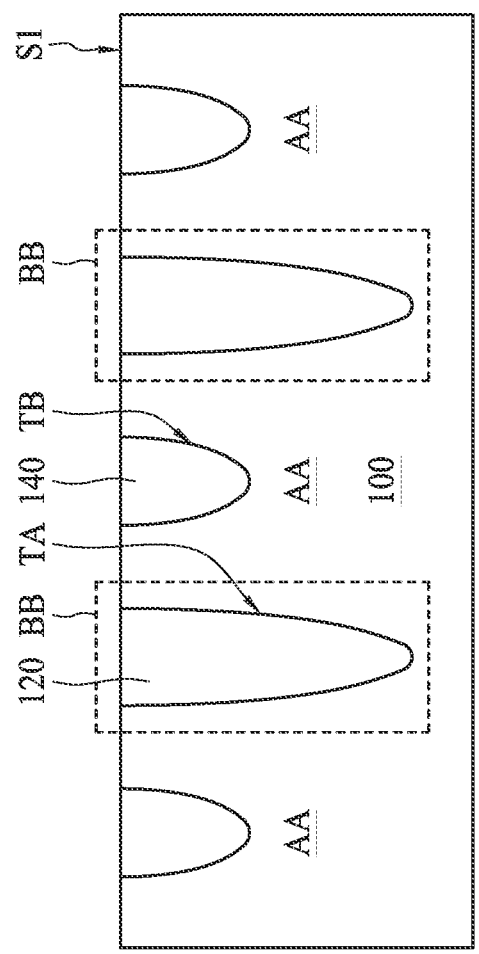

With reference to FIG. 12 to FIG. 14, a gate electrode formation process is performed on the substrate 100 according to step S103 in FIG. 8. Specifically, the gate electrode formation process at least includes a lithographic process, an etching process and a deposition process. First, referring to FIG. 12, a second photoresist pattern 130 is formed on the top surface S1 of the substrate 100. In some embodiments, the second photoresist pattern 130 defines the location of gate trenches to be formed.

Next, referring to FIG. 13, the substrate 100 is etched using the second photoresist pattern 130 as an etching mask to form several gate trenches TB. After the gate trenches TB are formed in the substrate 100, the second photoresist pattern 130 is removed using an ashing process or a wet strip process. In some embodiments, the gate trenches TB are alternately arranged with the isolation trenches TA.

Subsequently, referring to FIG. 14, a gate electrode material 140 is deposited to fill the gate trenches TB. In some embodiments, the gate electrode material 140 may include polysilicon or other suitable materials formed using a CVD process or an atomic layer deposition (ALD) process. In some embodiments, a CMP process is performed to remove the gate electrode material 140 above the top surface S1 of the substrate 100. In some embodiments, the gate trenches TB filled with the gate electrode material 140 are used as gate electrodes. In some embodiments, the gate electrodes may be arranged at predetermined intervals in the substrate 100.

Figure 15:
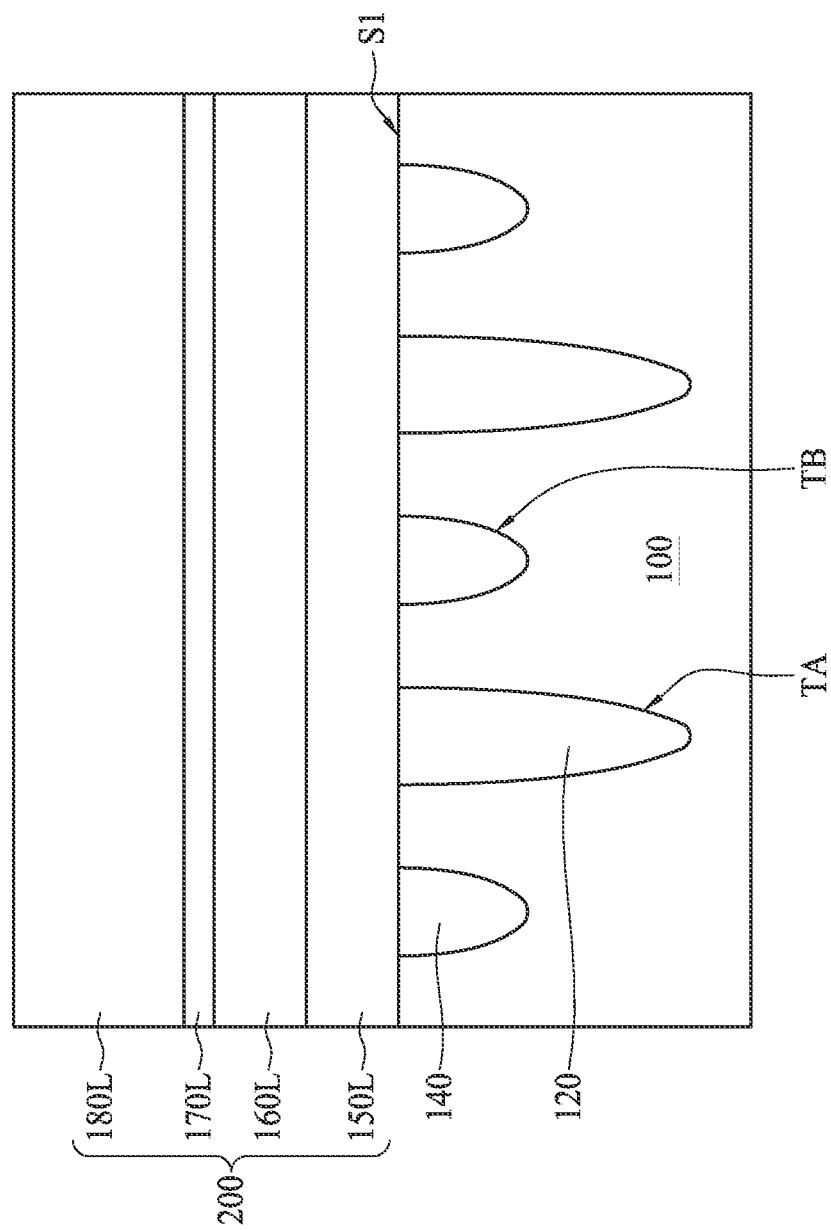

With reference to FIG. 15 to FIG. 21, a hard mask formation process is performed on the substrate 100 according to step S105 in FIG. 8. Referring to FIG. 15, in some embodiments, multiple layers are sequentially formed on the substrate 100. First, a cap layer 150L is formed on the top surface S1. Specifically, the cap layer 150L completely covers the dielectric material 120 in the isolation trenches TA and the gate electrode material 140 in the gate trenches TB. In some embodiments, the cap layer 150L is made of dielectric materials such as silicon nitride, silicon oxide, silicon oxynitride, or any combination thereof.

Next, a mask layer 160L is formed on the cap layer 150L. In some embodiments, the mask layer 160L mainly includes carbon materials and is used as a hard mask. Subsequently, an antireflective coating (ARC) layer 170L may be optionally formed on the mask layer 160L, followed by a photoresist layer 180L formed on the ARC layer 170L. In some embodiments, the ARC layer 170L can minimize the optical reflection of the photoresist layer 180L when the photoresist layer 180L is irradiated. In some embodiments, the ARC layer 170L is formed using a spin-coating process. In some embodiments, the photoresist layer 180L is a positive tone photoresist (positive photoresist), which means the exposed regions will be removed by a developing agent. In some embodiments, the photoresist layer 180L includes a chemical amplifier (CA) photoresist. The CA photoresist includes a photoacid generator (PAG) that can be decomposed to form acids during a lithography exposure process. More acids can be generated as a result of a catalytic reaction. At such time, the cap layer 150L, the mask layer 160L, the ARC layer 170L and the photoresist layer 180L together form a multilayer film 200 on the substrate 100.

Figure 16:
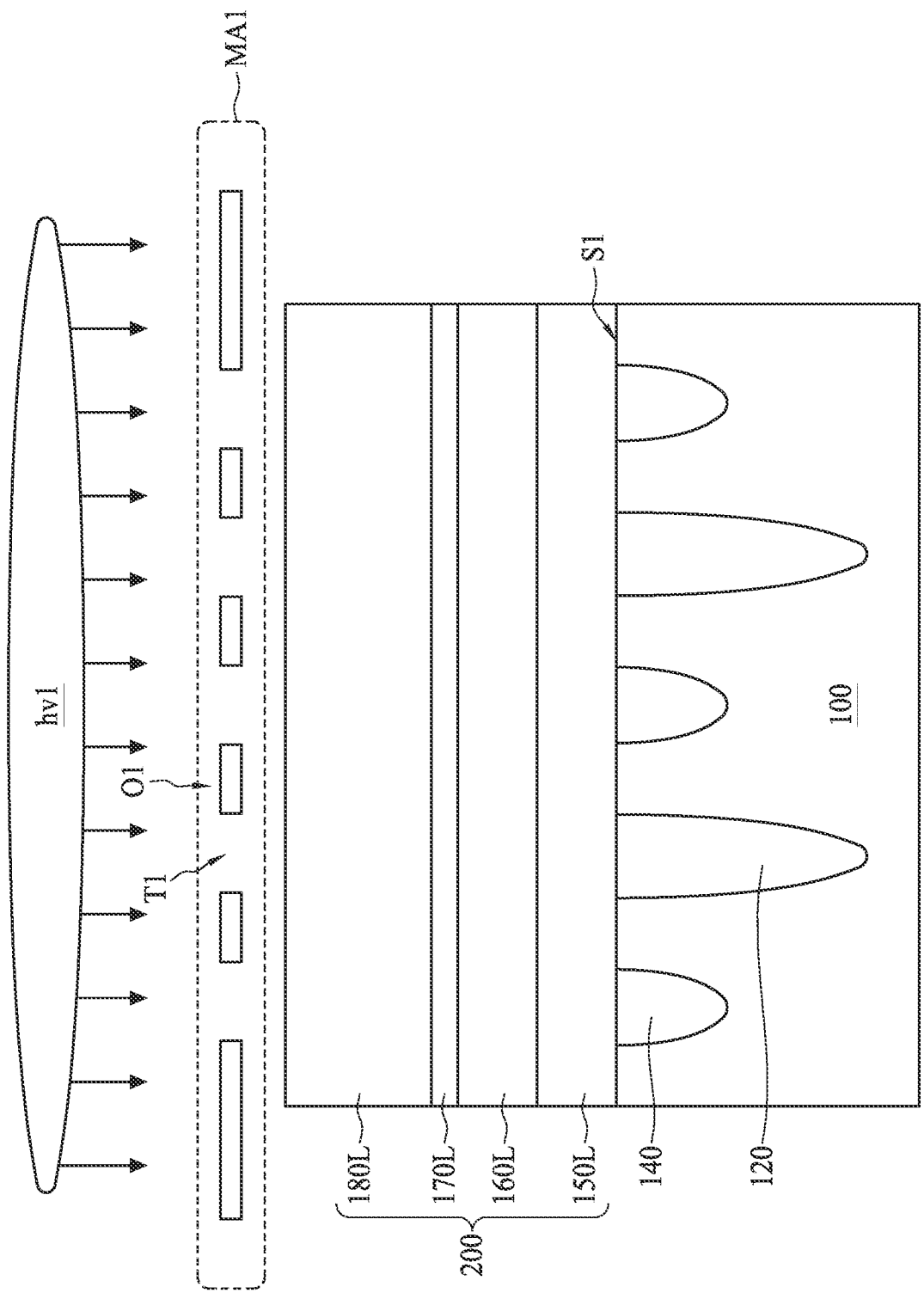

Referring to FIG. 16, a lithography process is performed on the photoresist layer 180L. The photoresist layer 180L is exposed to a radiation hv1 using a photomask MA1 and a lithography system (not shown). In some embodiments, the radiation hv1 may include, but is not limited to, deep ultraviolet (DUV) radiation. The photomask MA1 comprises multiple transparent portions T1 and multiple opaque portions O1. In some embodiments, the photomask MA1 may be a binary mask, a phase shift mask or any other type of mask suitable for use in the lithography system. The exposure induces a photochemical reaction that changes the chemical property of portions of the photoresist layer 180L. For example, the photoresist layer 180L corresponding to the transparent portions T1 is exposed and becomes more reactive in a developing process. In some embodiments, a post-exposure baking (PEB) may be performed after the photoresist layer 180L is exposed.

Figure 17:
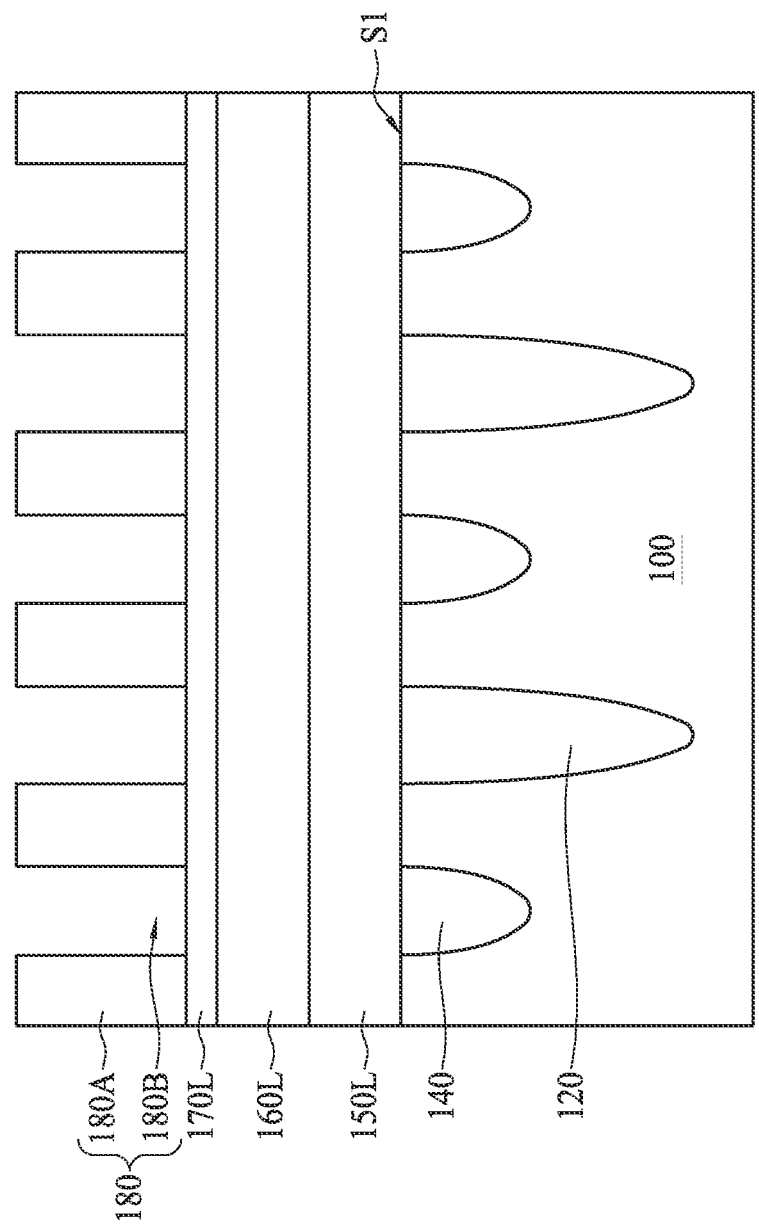

Referring to FIG. 17, an appropriate developing agent is used to rinse the exposed photoresist layer 180L. In some embodiments, exposed portions of the photoresist layer 180L are reacted with the developing agent and can be easily removed. After the exposed photoresist layer 180L is developed, a photoresist pattern 180 comprising multiple photoresist features 180A and multiple openings 180B arranged with the photoresist features 180A is formed. In some embodiments, the photoresist features 180A and the openings 180B respectively correspond to the opaque portions O1 and the transparent portions T1 of the photomask MA1. In some embodiments, portions of the ARC layer 170L are covered by the photoresist features 180A.

Figure 18:
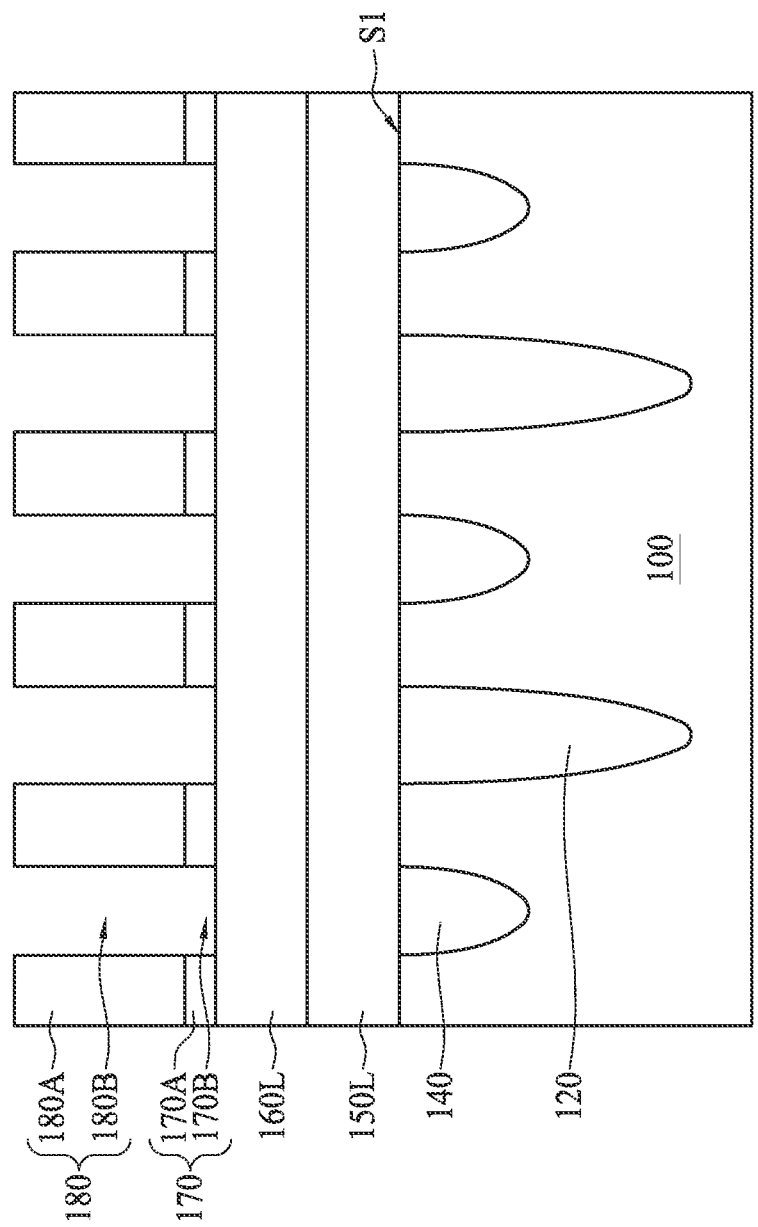

Referring to FIG. 18, a first etching is performed on the ARC layer 170L. In some embodiments, the first etching can be an RIE process, which anisotropically etches portions of the ARC layer 170L exposed by the openings 180B. Therefore, an ARC pattern 170 comprising multiple ARC features 170A and multiple openings 170B arranged with the ARC features 170A is formed. In some embodiments, the ARC features 170A and the openings 170B are respectively connected to the photoresist features 180A and the openings 180B. In some embodiments, portions of the mask layer 160L are covered by the ARC features 170A.

Figure 19:
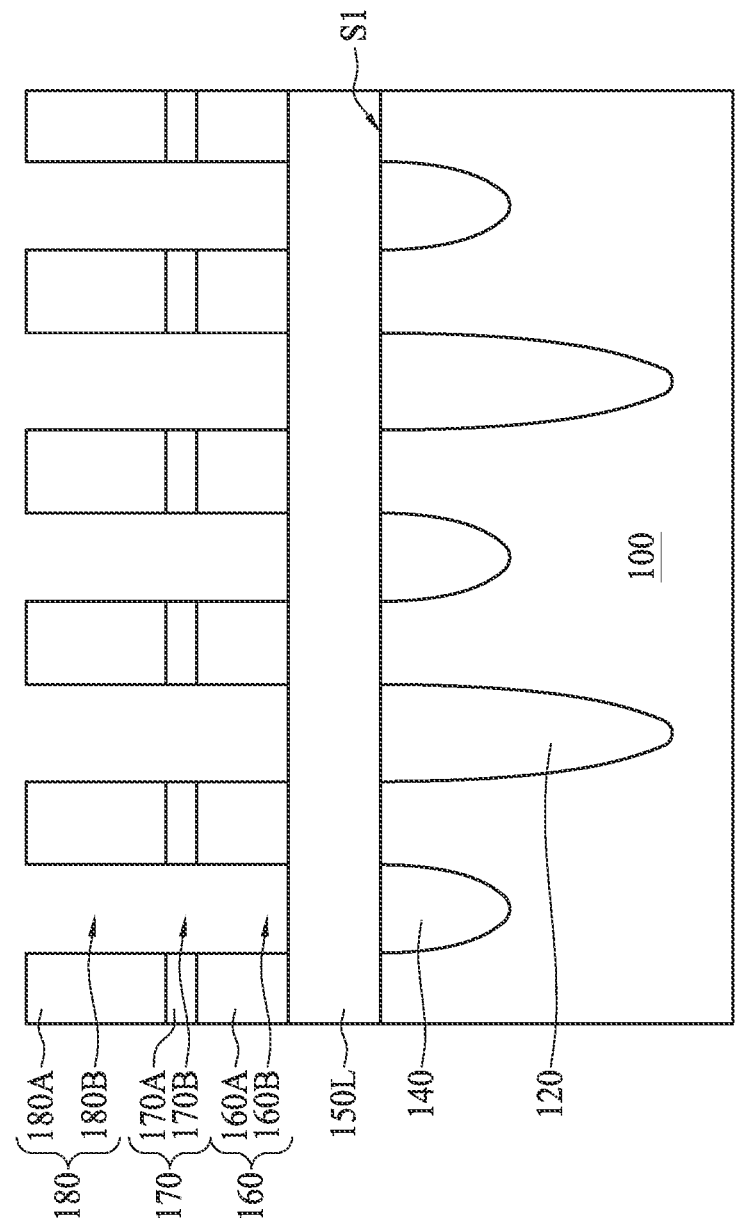

Referring to FIG. 19, a second etching is performed on the mask layer 160L. Specifically, the mask layer 160L is etched using the photoresist features 180A as an etching mask. In some embodiments, the second etching can be an RIE process, which anisotropically removes portions of the mask layer 160L exposed by the openings 170B. Therefore, a mask pattern 160 comprising multiple mask features 160A and multiple openings 160B arranged with the mask features 160A is formed. In some embodiments, the mask features 160A and the openings 160B are respectively connected to the ARC features 170A and the openings 170B. In some embodiments, portions of the cap layer 150L are covered by the mask features 160A.

Figure 20:
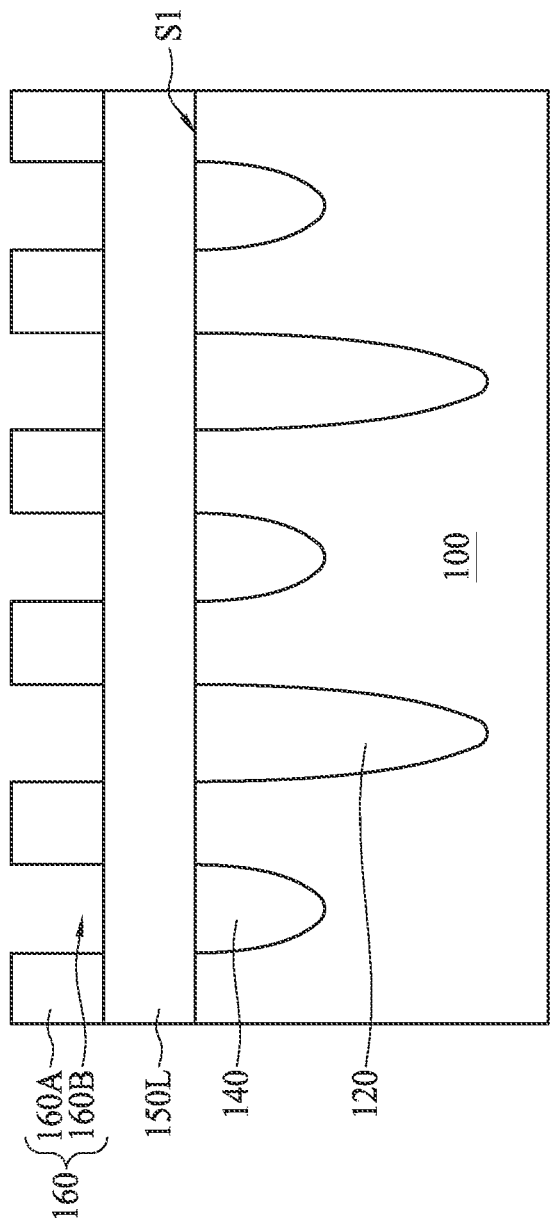

Referring to FIG. 20, the photoresist pattern 180 and the ARC pattern 170 are removed prior to the following process. In some embodiments, the removal may use an ashing process or a wet strip process.

Figure 21:
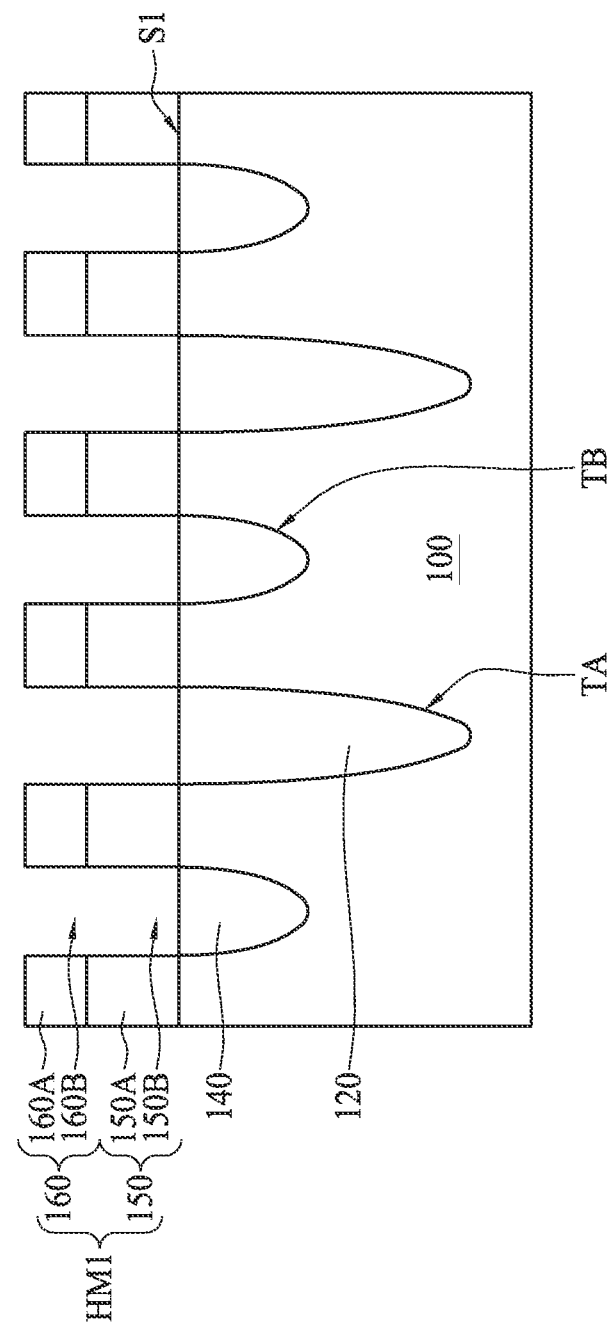

Referring to FIG. 21, a third etching is performed on the cap layer 150L. Specifically, the cap layer 150L is etched using the mask features 160A as an etching mask. In some embodiments, the third etching can be an RIE process, which anisotropically removes portions of the cap layer 150L exposed by the openings 160B. Therefore, a cap pattern 150 comprising multiple cap features 150A and multiple openings 150B arranged with the cap features 150A is formed. In some embodiments, the cap features 150A and the openings 150B are respectively connected to the mask features 160A and the openings 160B. In some embodiments, the dielectric material 120 and the gate electrode material 140 are exposed by the openings 150B. In some embodiments, the cap pattern 150 and the mask pattern 160 together may form a hard mask HM1 on the substrate 100.

Figure 22:
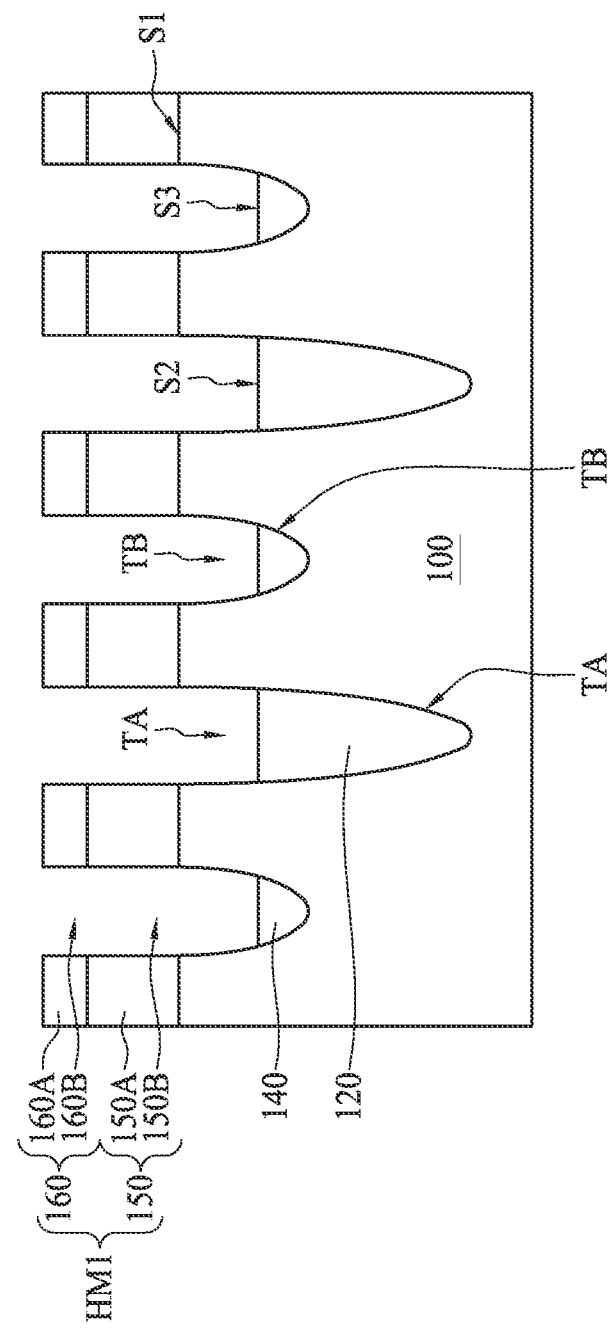

With reference to FIG. 22, an etch-back process is performed on the substrate 100 according to step S107 in FIG. 8. Specifically, the dielectric material 120 and the gate electrode material 140 are partially removed using an etching method 1000 depicted in FIG. 25. In some embodiments, portions of the dielectric material 120 and the gate electrode material 140 exposed by the hard mask HM1 are etched. Still referring to FIG. 22, after the etch-back process, top surfaces S2 of the etched dielectric material 120 and top surfaces S3 of the etched gate electrode material 140 are lower than the top surface S1 of the substrate 10. At such time, recesses within the isolation trenches TA and the gate trenches TB are produced again. In some embodiments, the recesses are filled with subsequently formed buried word lines.

Compared to the first comparative embodiment in FIG. 4, with the use of the etching method 1000, top surfaces S2 of the etched dielectric material 120 and top surfaces S3 of the etched gate electrode material 140 are substantially at the same level. The etching method 1000 according to an embodiment of the present disclosure may balance the unbalanced etching of the gate electrode material 140 and dielectric material 120 in the etch-back process.

Figure 23:
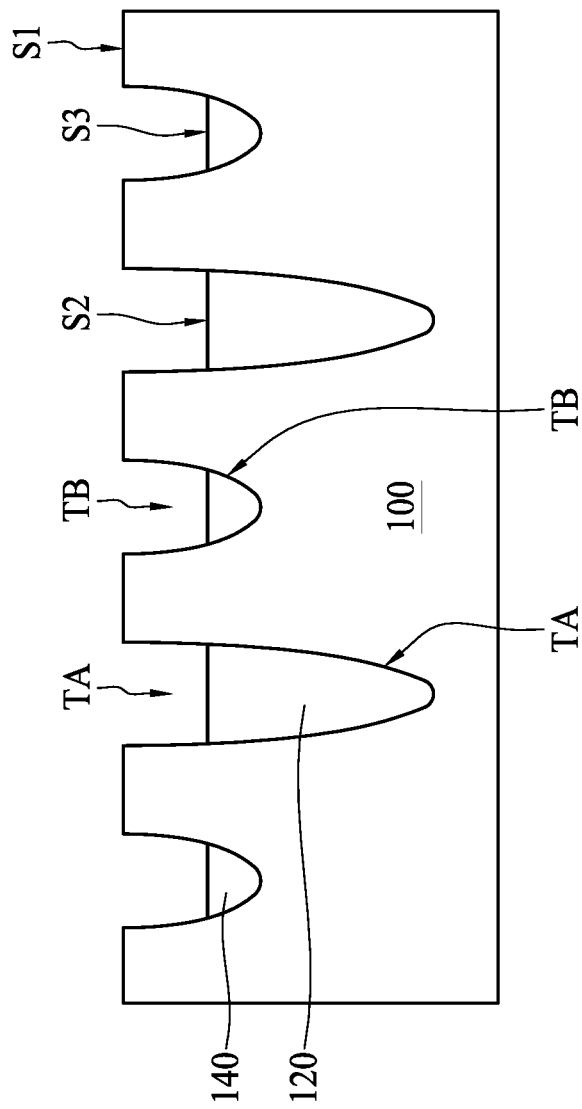

With reference to FIG. 23, the hard mask HM1 is removed from the substrate 100 according to step S109 in FIG. 8. In some embodiments, the hard mask HM1 is removed using an ashing process or a wet strip process before the formation of the buried word lines.

Figure 24:
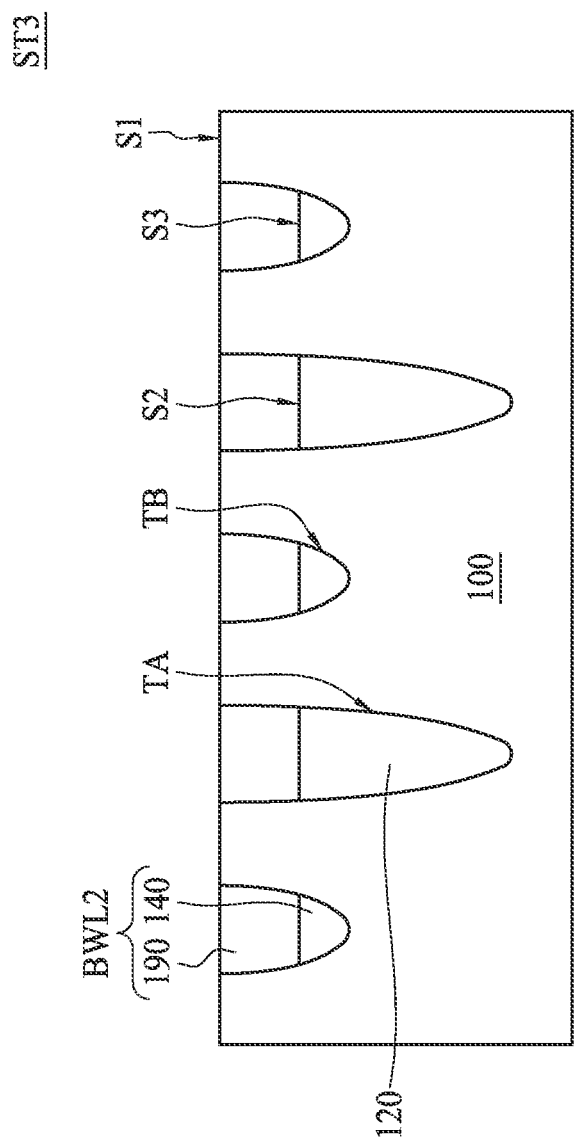

With reference to FIG. 24, a buried word line formation process is performed according to step S111 in FIG. 8. Specifically, a gate conductive material 190 is deposited to completely cover the dielectric material 120 and the gate electrode material 140. As a result, the isolation trenches TA and the gate trenches TB are filled by the gate conductive material 190. In some embodiments, the gate conductive material 190 is formed using a CVD process, a physical vapor deposition (PVD) process, or an ALD process. In some embodiments, the gate conductive material 190 may include any one or more of the group consisting of titanium nitride (TiN), tungsten nitride (WN), tantalum nitride (TaN), titanium silicon nitride (TiSiN), tantalum silicon nitride (TaSiN), and tungsten silicon nitride (WSiN). In some embodiments, the gate conductive material 190 is polished using a CMP process or a dry etch process to remove portions of the gate conductive material 190 over the top surface S1 of the substrate 100.

A plurality of buried word lines are formed after the gate conductive material 190 is completely deposited in the isolation trenches TA and the gate trenches TB. In some embodiments, the dielectric material 120, the gate electrode material 140 and the gate conductive material 190 disposed thereon may form a plurality of buried word line structures BWL2. In some embodiments, each of the buried word line structures BWL2 has a top surface coplanar with the top surface S1 of the substrate 100. At such time, a semiconductor structure ST3 with buried word lines is generally formed.

Figure 25:
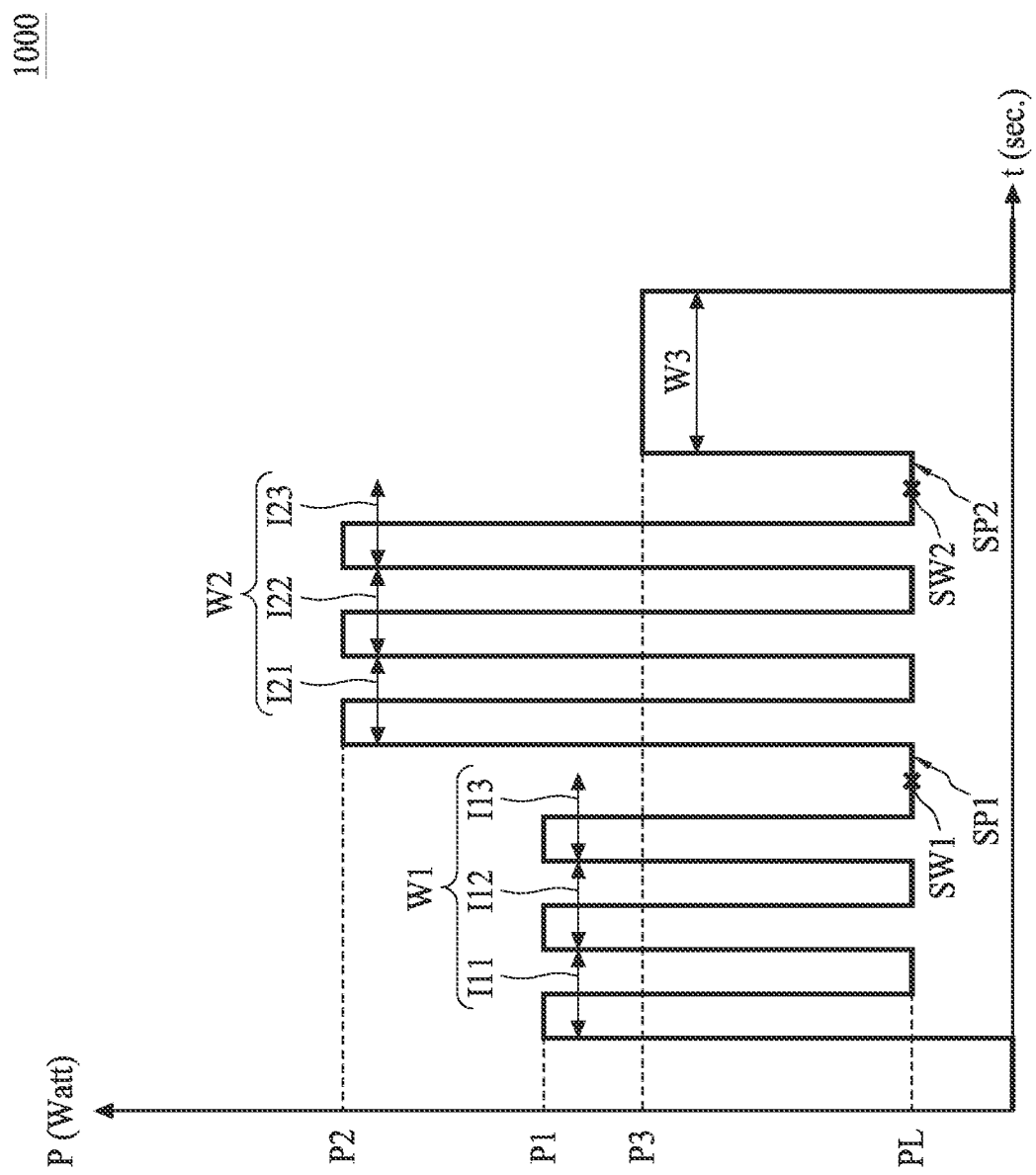
FIG. 25 is a plasma power-etching time diagram of the plasma used in the etching method applied in the etch-back process described in FIG. 22, in accordance with some embodiments of the present disclosure.

FIG. 25 is a plasma power-etching time diagram of the plasma used in the etching method 1000 applied in the etch-back process described in FIG. 22, in accordance with some embodiments of the present disclosure. The x-axis represents the etching time t (in seconds) and the y-axis represents the plasma power P (in watts). In some embodiments, the etching method 1000 comprises a first working stage W1, a second working stage W2 and a third working stage W3 performed in-situ in a single etching chamber.

During the first working stage W1, a first plasma is used, wherein the first plasma comprises a first combination of etchants. In some embodiments, the first plasma may have a first etching selectivity of polysilicon with respect to silicon dioxide of about 1:2. Therefore, the etching rate ratio of the gate electrode material 140 to the dielectric material 120 is about 1:2. In some embodiments, the first working stage W1 comprises two to four intervals. In a preferred embodiment, the first working stage W1 comprises three intervals I11, I12 and I13. In the interval I11, the first plasma is turned on and kept at a first high power P1 for 5 seconds. Next, the first plasma is adjusted to a low power PL and kept at the low power PL for 5 seconds to finish the interval I11. In the interval I12, the first plasma is adjusted to the first high power P1 and kept at the first high power P1 for 5 seconds. Next, the first plasma is adjusted to a low power PL and kept at the low power PL for 5 seconds to finish the interval I12. In some embodiments, the following interval is repeated as the interval I12. In the last interval, after the first plasma is kept at the low power PL for 5 seconds, a first switching step SW1 is performed to terminate the first working stage W1.

Still referring to FIG. 25, after the first switching step SW1, there is a first stabilizing period SP1 for the first combination of etchants to be changed to a second combination of etchants to form a second plasma. Next, the second working stage W2 begins with the use of the second plasma. In some embodiments, the second combination of etchants is different from the first combination of etchants. In some embodiments, the second plasma may have a second etching selectivity of polysilicon with respect to silicon dioxide of about 2:1. Therefore, the etching rate ratio of the gate electrode material 140 to the dielectric material 120 is about 2:1. In some embodiments, the second working stage W2 also comprises two to four intervals. In a preferred embodiment, the second working stage W2 comprises three intervals I21, I22 and I23. In the interval I21, the second plasma is kept at a second high power P2 for 5 seconds. Next, the second plasma is adjusted to the low power PL and kept at the low power PL for 5 seconds to finish the interval I21. In some embodiments, the second high power P2 may be different from the first high power P1. In other embodiments, the second high power P2 may be the same as the first high power P1. In some embodiments, the low power PL is still an "on" state, i.e., the power supply of the first plasma or the second plasma is always turned on. In some embodiments, the following intervals I22 and I23 are repeated as the interval I21. In the last interval, after the second plasma is kept at the low power PL for 5 seconds, a second switching step SW2 is performed to terminate the second working stage W2.

Still referring to FIG. 25, after the second switching step SW2, there is a second stabilizing period SP2 for the second combination of etchants to be changed to a third combination of etchants to form a third plasma. Next, the third working stage W3 begins with the use of the third plasma. In some embodiments, the third combination of etchants is different from the first or the second combination of etchants. In some embodiments, the third plasma may have a third etching selectivity of polysilicon with respect to silicon dioxide of about 3:1. Therefore, the etching rate of the gate electrode material 140 to the dielectric material 120 is about 3:1. In some embodiments, during the third working stage W3, one of a pair of electrodes in an etching system (not shown) used to perform the etch-back process is switched off. In the third working stage W3, the third plasma is kept at a third high power P3 for 5 to 20 seconds. Subsequently, the third plasma is turned off to finish the complete etch-back process. In some embodiments, the third high power P3 is lower than the first high power P1 or the second high power P2. In some embodiments, the high-power modes (P1, P2 and P3) indicate the primary etching phases and the low power mode (PL) indicates the phase of removal by etching of by-products.

The present disclosure provides an etching method that comprises three working stages performed in-situ in a single etching chamber. The three working stages include different combinations of etchants serving as the plasma. By changing the combination of etchants, the plasma can have different etching selectivities of polysilicon in the gate electrode material with respect to silicon dioxide in the dielectric material in the three working stages. In addition, the power applied to the plasma is adjusted in different intervals in the first and second working stages. During the primary etching phase, the plasma is at a high power. The etching by-products are removed when the plasma is at a low power. Therefore, in the etch-back process, the dielectric material in isolation trenches and the gate electrode material in gate trenches can be recessed into the top surface of the substrate. In addition, according to the etching method provided by the present disclosure, the top surface of the etched dielectric material and the top surface of the etched gate electrode material can be kept at a substantially identical level during the formation of buried word lines.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method of forming a semiconductor structure, comprising:
   providing a substrate comprising an isolation region, an active region adjacent to the isolation region and a first top surface, wherein the isolation region includes an isolation trench filled with a dielectric material, and the active region includes a gate trench filled with a gate electrode material, wherein etching rates between the dielectric material filled in the isolation trench and the gate electrode material filled in the gate trench are different;
   after filling the dielectric material in the isolation trench and filing the gate electrode material in the gate trench, forming a hard mask on the first top surface of the substrate to expose the dielectric material filled in the isolation trench and the gate electrode material filled in the gate trench;
   after forming the hard mask on the first top surface of the substrate, performing an etching process to remove top portions of the dielectric material and the gate electrode material exposed by the hard mask to form a second top surface of the dielectric material and a third top surface of the gate electrode material; and
   depositing a gate conductive material to cover the dielectric material and the gate electrode material,
   wherein the second top surface of the dielectric material and the third top surface of the gate electrode material are substantially at a same level and are substantially lower than the first top surface of the substrate.

2. The method according to claim 1, further comprising removing portions of the gate conductive material over the first top surface of the substrate.

3. The method according to claim 1, wherein the formation of the hard mas k comprises:
   forming a cap layer on the substrate, the dielectric material and the gate electrode material;
   forming a mask layer on the cap layer;
   forming an anti-reflective coating (ARC) layer on the mask layer; and
   forming a photoresist pattern on the ARC layer, wherein the photoresist pattern comprises a plurality of photoresist features.

4. The method according to claim 3, wherein the mask layer is etched using the photoresist features as an etching mask to form a mask pattern comprising a plurality of mask features.

5. The method according to claim 4, wherein the cap layer is etched using the mask features as an etching mask to form a cap pattern comprising a plurality of cap features.

6. The method according to claim 5, wherein the cap pattern and the mask pattern together form the hard mask on the substrate.

7. The method according to claim 1, wherein the etching method comprises:
   using a first plasma in a first working stage, wherein the first plasma has a first etching selectivity of the gate electrode material to the dielectric material;
   changing the first plasma to a second plasma in a second working stage, wherein the second plasma has a second etching selectivity of the gate electrode material to the dielectric material; and changing the second plasma to a third plasma in a third working stage, wherein the third plasma has a third etching selectivity of the gate electrode material to the dielectric material.

8. The method according to claim 7, wherein the first working stage, the second working stage and the third working stage are performed in-situ in a single etching chamber.

9. The method according to claim 7, wherein the first working stage comprises:
   a first interval, in which the first plasma is turned on and kept at a first high power and then adjusted to a low power and kept at the low power;
   a second interval, in which the first plasma is adjusted to the first high power and kept at the first high power and then adjusted to the low power and kept at the low power; and
   a third interval repeating the second interval, wherein after the third interval, a first switching step is performed to terminate the first working stage.

10. The method according to claim 9, wherein after the first switching step, a first stabilizing period is used to change the first plasma to the second plasma.

11. The method according to claim 10, wherein the second working stage comprises:
    a fourth interval, in which the second plasma is kept at a second high power and then adjusted to the low power and kept at the low power;
    a fifth interval, in which the second plasma is adjusted to the second high power and kept at the second high power and then adjusted to the low power and kept at the low power; and
    a sixth interval repeating the fifth interval, wherein after the sixth interval, a second switching step is performed to terminate the second working stage.

12. The method according to claim 11, wherein after the second switching step, a second stabilizing period is used to change the second plasma to the third plasma.

13. The method according to claim 12, wherein the third working stage comprises keeping the third plasma at a third high power.

14. The method according to claim 13, wherein the second high power is different from the first high power.

15. The method according to claim 13, wherein the third high power is lower than the first high power or the second high power.

16. The method according to claim 13, wherein the first high power, the second high power and the third high power indicate the primary etching phases.

* * * * *